United States Patent
Pomar Pedredo et al.

(10) Patent No.: US 11,933,833 B2
(45) Date of Patent: Mar. 19, 2024

(54) SYSTEM AND METHOD FOR DETECTING FAULTS IN MEDIUM VOLTAGE CIRCUITS

(71) Applicant: Aplicaciones Tecnologicas, S.A., Paterna (ES)

(72) Inventors: Verónica Pomar Pedredo, Paterna (ES); David Ruiz Muñoz, Paterna (ES)

(73) Assignee: Aplicaciones Tecnologicas, S.A., Paterna (ES)

( * ) Notice: Subject to any disclaimer, the term of this patent is extended or adjusted under 35 U.S.C. 154(b) by 0 days.

(21) Appl. No.: 18/252,405

(22) PCT Filed: Nov. 10, 2020

(86) PCT No.: PCT/ES2020/070691
§ 371 (c)(1),
(2) Date: May 10, 2023

(87) PCT Pub. No.: WO2022/101521
PCT Pub. Date: May 19, 2022

(65) Prior Publication Data
US 2023/0393186 A1 Dec. 7, 2023

(51) Int. Cl.
*G01R 31/08* (2020.01)
(52) U.S. Cl.
CPC ......... *G01R 31/083* (2013.01); *G01R 31/088* (2013.01)
(58) Field of Classification Search
CPC ............................ G01R 31/083; G01R 31/088
USPC ....................................................... 324/522
See application file for complete search history.

(56) References Cited

U.S. PATENT DOCUMENTS

2018/0233895 A1\* 8/2018 O'Regan .......... H02J 13/00034

FOREIGN PATENT DOCUMENTS

| CN | 106972464 A | 7/2017 |
| JP | 2010164514 A | 7/2010 |
| JP | 2010166769 A | 7/2010 |

OTHER PUBLICATIONS

International Search Report, PCT/ES/2020/070691, 4 pages, dated Jul. 29, 2021.
Written Opinion, PCT/ES/2020/070691, 5 pages, dated Jul. 29, 2021.

\* cited by examiner

*Primary Examiner* — Farhana A Hoque
(74) *Attorney, Agent, or Firm* — Danielson Legal LLC

(57) ABSTRACT

Fault detection system (800) for a medium voltage circuit comprising assemblies of an electric power distribution cable (205), a first transformation center (210) comprising a first transformer and a first grounding conductor (603), a first grounding system comprising a first grounding resistor (RPAT1) connected to the first transformer through the first grounding conductor (603), the first transformation center (210) connected to a first end of the cable (205) and a second transformation center (220) comprising a second transformer and a second grounding conductor (603), a second grounding system comprising a second grounding resistor (RPAT2) connected to the second transformer through the second grounding conductor (603), the second transformation center (220) connected to a second end of the cable (205).

10 Claims, 6 Drawing Sheets

SYSTEM AND METHOD FOR DETECTING FAULTS IN MEDIUM VOLTAGE CIRCUITS

CROSS REFERENCE TO RELATED APPLICATIONS

This application is the U.S. national phase of International (PCT) Patent Application No. PCT/ES2020/070691, filed internationally on Nov. 10, 2020, the entire disclosure of which is hereby incorporated by reference in its entirety.

OBJECT OF THE INVENTION

The object of the present invention is a method and system for detecting faults in insulated electric power distribution cables.

BACKGROUND OF THE INVENTION

Currently there are various methods, devices and systems for detecting and locating faults in electric power distribution cables.

Existing methods, devices and systems involve either the continuous monitoring of the electric power lines (phases) in the medium voltage section or the generation of an excitation signal, of different natures, which is applied to the cable or to one of its parts after the fault has occurred and, from this excitation signal, an effect is produced which is measurable by the equipment and which is related to the fault location.

Some of the already known methods refer to the detection of pressure or acoustic waves when applying a current pulse on the cable, to the generation of an electric arc through the direct application of high voltage to the cable, reflections of high frequency waves, etc.

In the case of the methods, devices and systems based on the continuous monitoring of the electric power lines (phases) in the medium voltage section, these have the main drawback of the complexity of the insulation when working with high voltage levels, in addition to the complexity of the monitoring system itself, since the electric power is distributed in a three-phase system, which implies that the monitoring must be carried out on each of the three phases that compose it. This implies that medium voltage network monitoring pieces of equipment are bulky and complex.

In the case of the methods, devices and systems based on the generation of an excitation signal and the subsequent processing of the effect produced by said signal, they have the drawback of requiring direct contact with the cable and disconnection from the power supply network, which hinders the operation and extends the time necessary to carry out the location.

DESCRIPTION OF THE INVENTION

In electric power distribution systems, it is common to use insulated cables that run, in most cases underground, especially in urban areas. As shown in FIG. 1, these power distribution cables (101) are made of an electrical conductor (101), through which the electric power flows, and by different layers that are added coaxially to the main conductor until reaching a cover (103). One of the layers of these cables is the screen or mesh (102), which is also made of conductive material and is used as a ground terminal, that is, it is connected to grounding systems.

It may be the case that the internal insulation of the cable is degraded for different reasons and that a conductive path is generated, normally by means of an electric arc, between the conductor (101) and the mesh (102) connected to ground, generating what is known as fault current. The electrical network protection systems are in charge of acting when this condition is detected in the network, leaving the network without power, thus minimizing the damages produced and allowing the pertinent repairs to be carried out before proceeding with the network reset.

From the point of view of network operability, it is desirable that the time that elapses, from the moment a fault is generated and the network is left without service, until the service is restored, be as short as possible. This time is made up of three main components: the travel time of the personnel performing the repair, the fault location time and the fault repair time.

The main objective of the fault detection method and system according to the present invention is to reduce the fault location time in medium voltage cables, thus improving the service quality index of the network operator.

The method according to the present invention differs from the methods based on the continuous monitoring of the power lines and from the methods based on the generation of an excitation signal after the fault occurs. In particular, the method according to the present invention is based on the continuous monitoring of the current that flows through the grounding conductor that connects the metallic structures of the transformer of the transformation centers with the grounding system.

Thus, in a first aspect, the present invention relates to a method for locating faults in electric power distribution cables, the method is applied to a medium voltage circuit comprising at least one electric power distribution cable, a first transformation center comprising a first transformer and a first grounding conductor, a first grounding system comprising a first grounding resistor connected to the first transformer through the first grounding conductor. The first transformation center is connected to a first end of the cable. The medium voltage circuit also comprises a second transformation center comprising a second transformer and a second grounding conductor, a second grounding system comprising a second grounding resistor connected to the second transformer through the second grounding conductor. The second transformation center is connected to a second end of the cable.

The method comprises identifying a fault in the cable by monitoring through current threshold in at least one of the grounding conductors, in case of fault identification, measuring a first current value $I_{med1}$ through the first grounding conductor, obtaining the value of the first resistor, measuring a second value of current $I_{med2}$ through the second grounding conductor, obtaining the value of the second resistor, calculating a relative distance d1 from a point on the cable where the fault occurs to the first transformation center, such that:

$$d_1 = \frac{I_{med2} \cdot R_{PAT2} - I_{med1} \cdot R_{PAT1}}{(I_{med2} + I_{med1})}$$

The method also comprises calculating a distance d2 from the point of the cable where the fault occurs to the second transformation center;

$$d_2 = \frac{I_{med2} \cdot (1 - R_{PAT2}) + I_{med1} \cdot (1 + R_{PAT1})}{(I_{med2} + I_{med1})}$$

The method also comprises identifying the location of the fault based on the distances d1 and d2.

This method uses comparative measurements from sensor devices distributed in each of the transformation centers that are part of the circuit to be monitored. This method has the advantage of detecting and locating the fault in real time in an unattended way and without intervention, using compact devices that do not require the necessary insulation to monitor medium voltage lines, so their volume is substantially reduced.

In a second aspect, the present invention relates to a fault detection system for a medium voltage circuit that comprises sets of electric power distribution cables, a first transformation center that comprises a first transformer and a first grounding conductor and a first grounding system comprising a first grounding resistor connected to the first transformer through the first grounding conductor. The first transformation center is connected to a first end of the cable. The medium voltage circuit further comprises a second transformation center comprising a second transformer and a second grounding conductor, a second grounding system comprising a second grounding resistor connected to the second transformer through the second grounding conductor. The second transformation center is connected to a second end of the cable. The fault detection system comprises a set of sensors comprising wireless communication means and a processing unit, wherein a first sensor comprises means for connecting to the first grounding conductor and is configured to detect a cable fault by detecting a threshold current value through the first grounding conductor. In case of fault identification, the first sensor is configured to measure a first current value $I_{med1}$ through the first grounding conductor, obtain the value of the first resistor and transmit $I_{med1}$ and to the processing unit. In the system, a second sensor comprises means for connecting to the second grounding conductor, and is configured to detect a cable fault by detecting a threshold current value through the second grounding conductor. In case of fault identification the second sensor is configured to measure a second current value $I_{med2}$ through the second grounding conductor, obtain the value of the second resistor and transmit $I_{med2}$ and to the processing unit. The processing unit stores instructions for calculating a relative distance d1 from a point on the cable where the fault occurs to the first transformation center, such that:

$$d_1 = \frac{I_{med2} \cdot R_{PAT2} - I_{med1} \cdot R_{PAT1}}{(I_{med2} + I_{med1})}$$

The processing unit also stores instructions to calculate a distance d2 from the point of the cable where the fault occurs to the second transformation center, such that:

$$d_2 = \frac{I_{med2} \cdot (1 - R_{PAT2}) + I_{med1} \cdot (1 + R_{PAT1})}{(I_{med2} + I_{med1})}$$

and identify the fault location based on the distances d1 and d2.

DESCRIPTION OF THE DRAWINGS

To complement the description being made and in order to help a better understanding of the features of the method and system for detecting faults in medium voltage cables, according to a preferred example of practical embodiment thereof, a set of drawings is attached as an integral part of said description, wherein, for illustrative and non-limiting purposes, the following has been represented.

PREFERRED EMBODIMENT OF THE INVENTION

Figure 1:
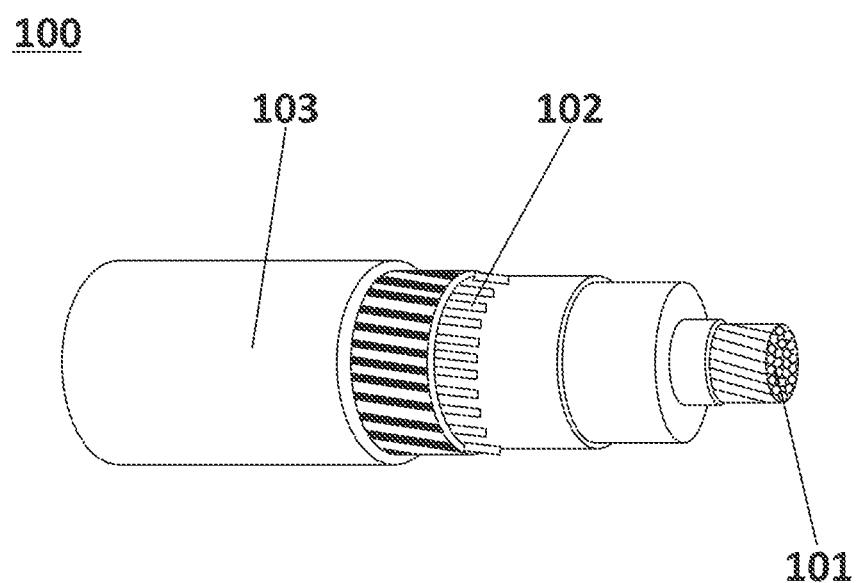
FIG. 1 shows the parts of a medium voltage cable.
Figure 2:
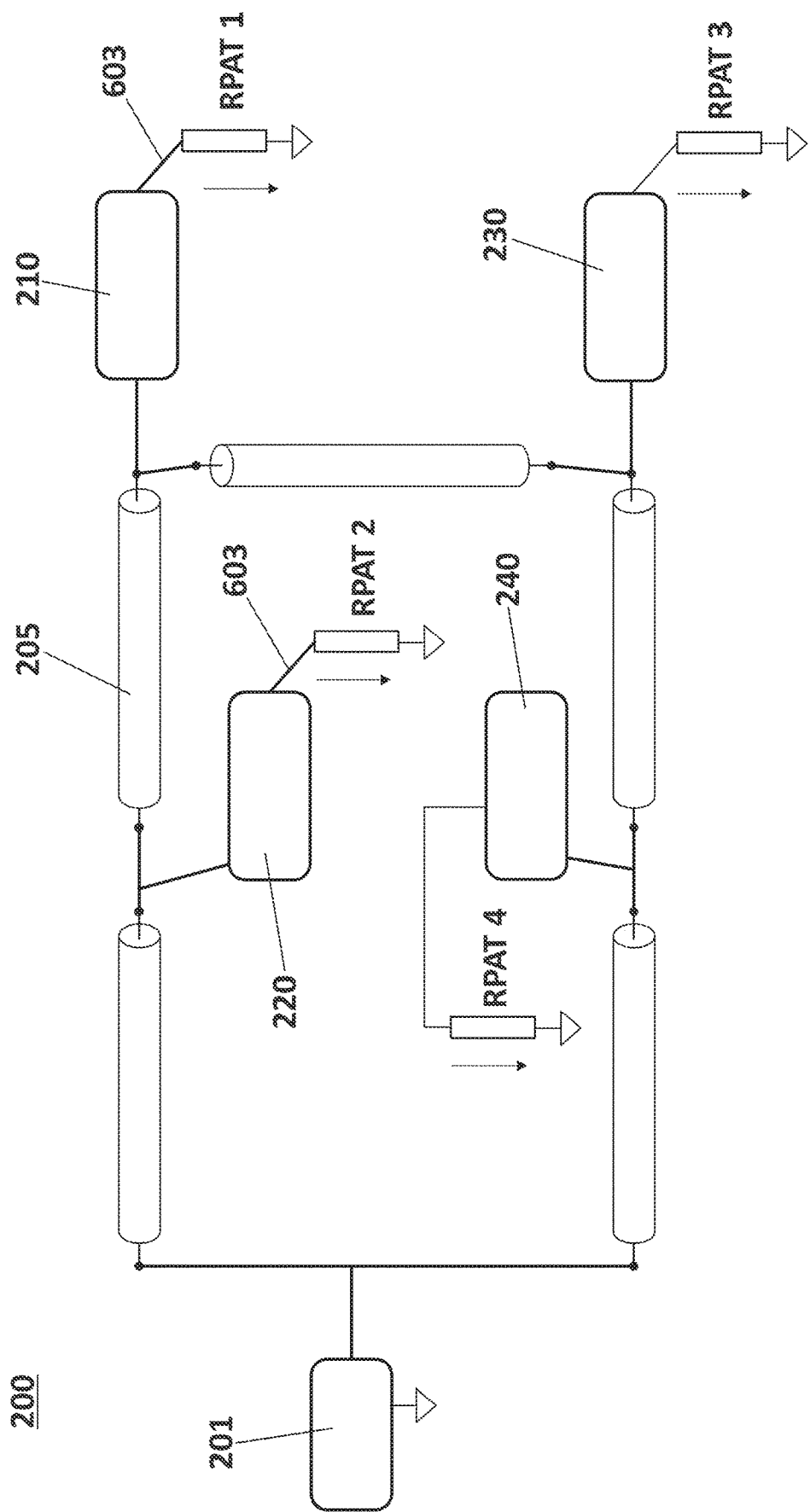
FIG. 2 shows a medium voltage circuit in a ring configuration.

FIG. 2 represents a medium voltage circuit (200) in a ring configuration with a plurality of cables (205), fed by the outlet of a substation (201) and having four transformation centers (210, 220, 230, 240) as part of the fault detection system. Each transformation center (210, 220, 230, 240) is associated with a grounding system, represented in the following figure by grounding resistors (RPAT1-4) and by a grounding conductor (603) of the transformer that allows connecting the metal elements of the transformer of the transformation center (210, 220, 230, 240) to the grounding system represented by (RPAT1-4).

Particularizing the invention for one of the cables (205) of the circuit (200), a first transformation center (210) can be seen that comprises a first transformer and a first grounding resistor (RPAT1) as part of a first grounding system connected to the first transformation center (210). The first transformation center (210) is in turn connected to a first end of the cable (205). The grounding conductor (603) of the transformer allows the metal elements of the transformer of the transformation center (210) to be connected to the grounding system represented by the resistor (RPAT1).

Furthermore, the fault detection system comprises a second transformation center (220) comprising a second transformer and a second grounding resistor (RPAT2) as part of a second grounding system connected to the second transformer through the grounding conductor (603). The second transformation center (220) is in turn connected to a second end of the cable (205).

In normal operation (without faults), the current through the grounding conductor of the transformer is only a few milliamps. However, when a fault occurs, a conductive path is generated between the main conductor of the cable (205) and its mesh, so that portion of the electric power passes through the cable mesh (205) heading towards the two ends of the cable (205), whose mesh is connected to the grounding systems with resistors (RPAT1, RPAT2) connected to the two transformation centers (210, 220) that are at the ends of the cable (205), generating an increase in the value of the current in the grounding conductor (603) of the transformer in the transformation centers (210, 220). The impedance that "sees" the current in each of the two directions shall determine the amount of current flowing in each direction.

The value of the current flowing in each direction shall depend on the value of the fault current and other parameters such as the network configuration, the length of the cables, the neutral regime, the type of fault, the location in which the fault has occurred and the grounding resistor values of the grounding systems of each of the transformation centers.

Figure 3:
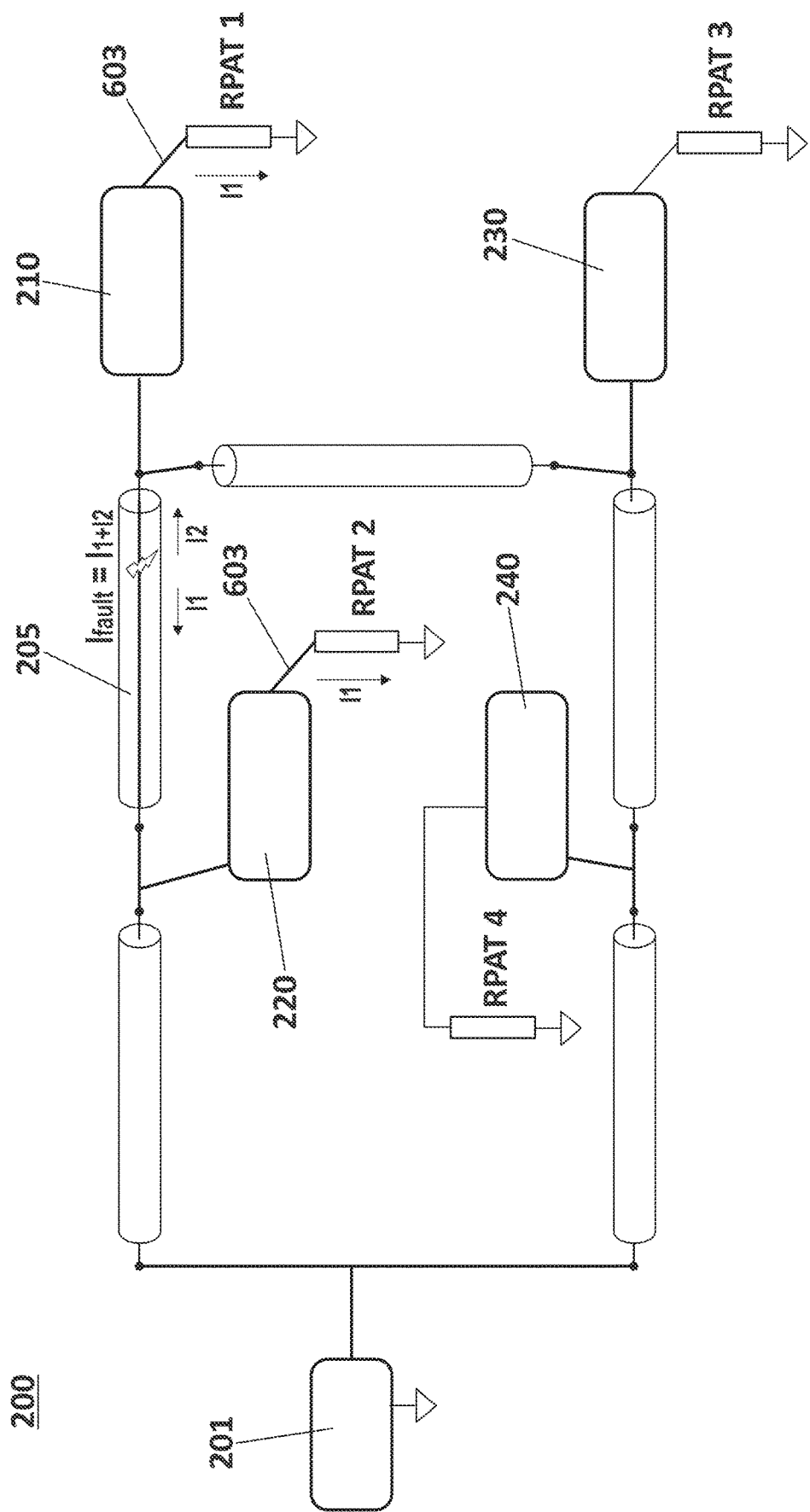
FIG. 3 shows the medium voltage circuit in a ring configuration in a fault condition.

As shown in FIG. 3, in a fault situation, a fault current $I_{fault}$ will be produced, which will bifurcate in two opposite directions, towards the two transformation centers (210, 220) that are at the ends of the cable.

Figure 4:
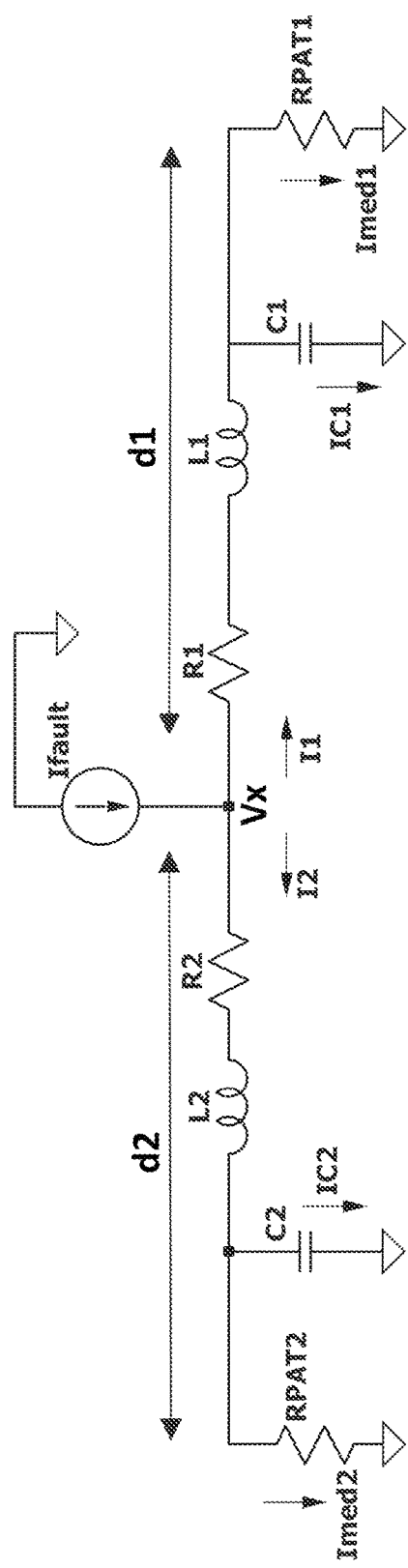
FIG. 4 shows an electrical circuit showing fault currents.

The calculation method for the location of faults in electric power distribution cables is based on the following electrical equivalent shown in FIG. 4 in which the fault current $I_{fault}$ is divided into 2 currents $I_1$ and $I_2$. In turn, these two currents are divided into two components each, so that:

$$I1 = I\text{med}1 + IC1;$$

$$I2 = I\text{med}2 + IC2$$

Imed1 and Imed2 are the currents that flow through the grounding conductor, and therefore the currents measured by the distributed sensor pieces of equipment.

To perform the circuit analysis, it is going to be considered that the values of L1, R1, C1, L2, R2, and C2 are defined by the values of distributed impedance of the cable (205) (L, R and C, whose values are provided by the cable manufacturer) multiplied by the value in meters, of the distance from the point where the fault occurs to the first transformation center (210) (d1) or the second transformation center (220) (d2), in this way, the following ratios are obtained:

$$L1(H) = L\left(\frac{H}{m}\right)*d1(m),\ R1(\Omega) = R\left(\frac{\Omega}{m}\right)*d1(m),\ C1(F) = C\left(\frac{F}{m}\right)*d1(m)$$

$$L2(H) = L\left(\frac{H}{m}\right)*d2(m),\ R2(\Omega) = R\left(\frac{\Omega}{m}\right)*d2(m),\ C2(F) = C\left(\frac{F}{m}\right)*d2(m)$$

If the circuit analysis is carried out, the following development can be reached:

$$I_{med1} = \frac{V_x}{R_{PAT1} \cdot [1 - CL\omega^2 d_1^2 + RCj\omega d_1^2] + Lj\omega d_1 + Rd_1}$$

$$I_{med2} = \frac{V_x}{R_{PAT2} \cdot [1 - CL\omega^2 d_2^2 + RCj\omega d_2^2] + Lj\omega d_2 + Rd_2}$$

When considering the usual values of R, L and C in v medium voltage cables, we find the following orders of magnitude:

| PARAMETER | ORDER OF MAGNITUDE OF VALUE |
|---|---|
| L(H/m) | $10^{-6}$ |
| R(Ω/m) | $10^{-4}$ |
| C(F/m) | $10^{-10}$ |
| Cable length (m) | $10^2$-$10^3$ |
| Frequency (Hz) | $10^1$ |

Which implies that the term $[1-CL\omega^2 d_x^2 + RCj\omega d_x^2]$ can be approximated to 1 by reducing the previous expressions to:

$$I_{med1} = \frac{V_x}{R_{PAT1} + Lj\omega d_1 + Rd_1}$$

$$I_{med2} = \frac{V_x}{R_{PAT2} + Lj\omega d_2 + Rd_2}$$

By dividing $I_{med1}$ between $I_{med2}$ it is that:

$$\frac{I_{med1}}{I_{med2}} = \frac{R_{PAT2} + Lj\omega d_2 + Rd_2}{R_{PAT1} + Lj\omega d_1 + Rd_1} = \frac{R_{PAT2} + d_2 \cdot (Lj\omega + R)}{R_{PAT1} + d_1 \cdot (Lj\omega + R)}$$

If the lengths d1 and d2 are normalized to unit, then the total length of the cable where the fault has occurred will be 1 y, thus d1+d2=1. With this consideration, the previous expression is as follows:

$$\frac{I_{med1}}{I_{med2}} = \frac{R_{PAT2} + (1 - d_1) \cdot (Lj\omega + R)}{R_{PAT1} + d_1 \cdot (Lj\omega + R)}$$

By solving for d1 in the previous expression and considering that $R_{PATX} >>> Lj\omega + R$, it is that:

$$d_1 = \frac{I_{med2} \cdot R_{PAT2} - I_{med1} \cdot R_{PAT1}}{(I_{med2} + I_{med1}) \cdot (Lj\omega + R)}$$

And since L, R and w are constants, we can define the term K, so that the previous expression is as:

$$d_1 = K \cdot \frac{I_{med2} \cdot R_{PAT2} - I_{med1} \cdot R_{PAT1}}{(I_{med2} + I_{med1})}$$

And therefore you can solve for $d_2$ as:

$$d_2 = \frac{I_{med2} \cdot (1 - K \cdot R_{PAT2}) + I_{med1} \cdot (1 + K \cdot R_{PAT1})}{(I_{med2} + I_{med1})}$$

K=1 can be used, as a valid constant for most scenarios. Thus, it is shown that starting from the measurement of the current in each grounding conductor (603) of each transformation center (210, 220) and with the value of the grounding resistor ($R_{PAT1}$, $R_{PAT2}$) at the time of the fault in each transformation center, it is possible to determine the relative distances, d1 and d2, at which the fault has occurred.

Figure 5:
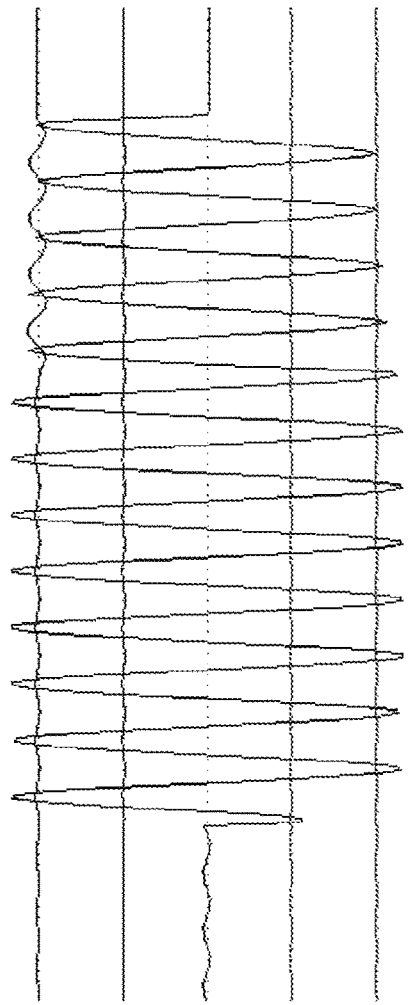
FIG. 5 shows the transient behavior of the fault current.

FIG. 5 shows the behavior of the fault current $I_{fault}$ (500) of a transient nature of the fault, which implies that, at the moment in which it occurs, there is an initial moment in which a high frequency transient phenomenon is generated, followed by a stationary period of time characterized by a signal at the frequency of the electrical network.

Due to this, the impedance that the grounding system has at the initial time represented in the figures by (RPAT1-4), where the frequency components of the transient current are high, will have the contribution of a resistive portion, but also of a reactive portion (capacitive, inductive or a combination of both) appreciable, so it is desirable to be able to determine the value of each of the portions R, L and C that constitute the grounding system in order to characterize the complete phenomenon and not just in steady state. One way to obtain these equivalents is by implementing a Bode diagram in magnitude and in phase, for which it is required to measure the value of the impedance and the phase shift between the voltage and the current at different frequencies (frequency sweep).

However, it is contemplated that the location method of the present invention may comprise means adapted to obtain and process other data from the network itself, such as those relating to the length or section of the cables, the type of insulation in each section, the path of the lines, the junction points, etc., to achieve a more exact model of the network and improve the location and identification of the fault.

Based on the foregoing, the fault detection system (800) comprises:

A set of distributed sensors (600), each installed by means of a transducer (602) in the grounding conductor (603) of each of the transformation centers (210, 220, 230, 240) of the circuit (200) to be monitored, wherein each distributed sensor (600) is configured to continuously monitor the current $I_{med}$ in said grounding conductor (603) and detect the fault in the cable (205) by current threshold, as well as determine the grounding resistor (RPAT1-4) at the moment in which the fault occurs in the cable (205), identifying the resistive portion and the reactive portion (L and C) using a frequency sweep to obtain a Bode diagram in magnitude and phase.

In addition, each distributed sensor (600) is configured to store the data internally so that it can be transmitted remotely to a processing unit (818).

Each distributed sensor (600) comprises wireless transmission means (819) for the remote sending of the data acquired by each sensor equipment (600) to a remote processing unit (18). Each distributed sensor (600) comprises a synchronization system (821) that allows the data from the different distributed sensors to have a single time base when processed.

The system (800) comprises a processing unit (818) where the data is stored and grouped and where the analysis of the received data can be performed in real time to obtain the distance values d1 and d2.

The system (800) comprises alert and display means, preferably an alarm system that may indicate to the user the fault condition and the approximate location of the fault from the measurements recorded by the sensor devices (600) and their analysis to obtain values of distance d1 and d2.

Figure 6:
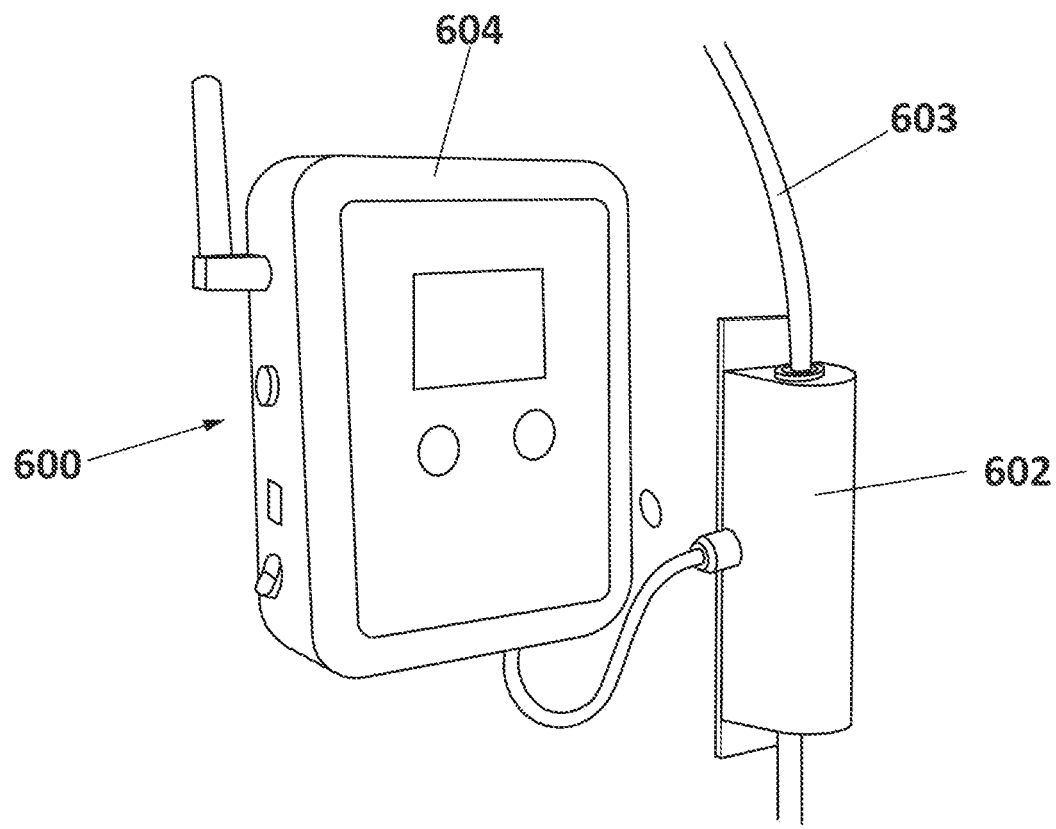
FIG. 6 shows an example of a sensor distributed in accordance with the present invention.

FIG. 6 shows an example of a distributed sensor (600) in accordance with the present invention. The sensor (600) comprises a transducer (602) through which the grounding conductor (603) of the transformer of one of the transformation centers runs. The electronics of said sensor device (600) is comprised in the containment housing (604).

Figure 7:
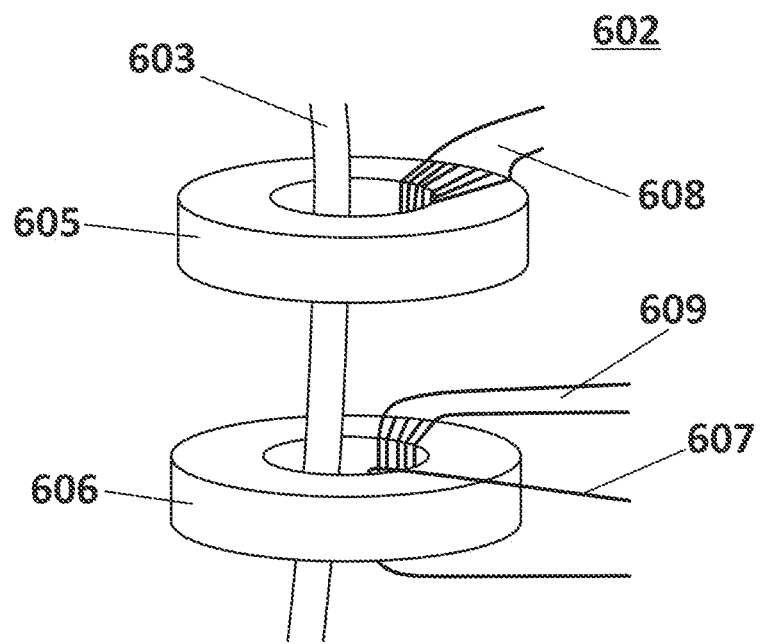
FIG. 7 shows an example of a transducer according to the present invention.

FIG. 7 shows the transducer element (602) connected to the sensor (600). The transducer element (602) is formed by two toroidal magnetic cores (605) and (606) through which the grounding conductor (603) is passed, one of the cores (605) induces an electromotive force (emf) in the conductor to be monitored by means of a set of injection loops (608), while the other toroid (606) records the value of the current that said emf generates by the conductor by means of a set of measuring loops (609), which depends on the impedance of said conductor (603). An additional loop (607), wound on the measuring magnetic core (606), is also required to be able to determine the induced voltage in the conductor (603).

Figure 8:
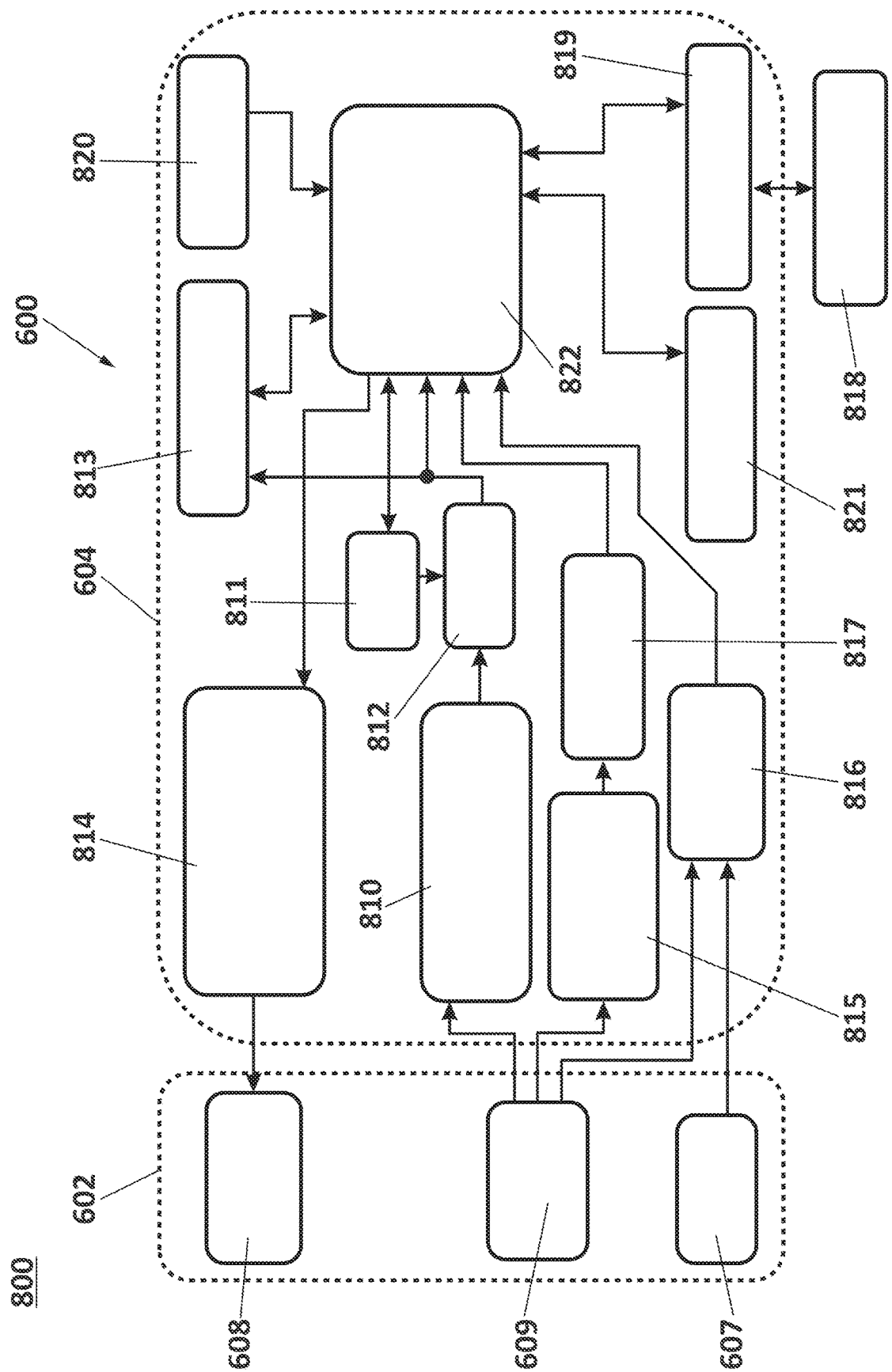
FIG. 8 shows an example of a fault detection system according to the present invention.

FIG. 8 shows parts of the system (800). In particular, FIG. 8 shows a distributed sensor (600), the transducer (602) as an interface element between the distributed sensor (600) and the grounding cable (603) as well as the processing unit (818) of the system (800).

As shown in FIG. 8, the distributed sensor (600) comprises:

A continuous current monitoring system (810) connected to the set of measuring loops (609) that detects the fault condition by subsequent comparison with a programmable threshold (811).

A programmable amplification system (817) that allows the range to be adjusted automatically and is connected to the output of the filtering system (815). The programmable gain amplifier (817) and the programmable threshold (811), allow its adjustment both locally and remotely and allow optimizing the detection and location of faults in environments with different levels of electrical noise and with different expected values of fault current.

A circular buffer (812) connected to the continuous current monitoring system (810) and to the programmable threshold (811) configured so that, when the fault condition is detected, it is recorded at least 10 ms prior to the instant in which the fault occurs and 300 ms after said instant, sending the set of recorded data to a storage system (813).

A current injection system (814) at multiple frequencies, connected to the set of injection loops (608) to be able to perform the frequency sweep, necessary for the characterization of the reactive equivalents (L and C) of the grounding resistor measurement (RPAT1-4). Preferably, an AM amplitude modulation system will be used for this multi-frequency injection system, which will simplify the post-processing, measurement and subsequent interpretation process.

A filtering system (815), connected to the set of measuring loops (609) in order to reduce the noise of the environment to acceptable levels. Preferably, said filtering system comprises an amplitude demodulation system that simplifies the filtering process.

A system for measuring the phase shift (816) between the signals from the set of measuring loops (609) and the additional loop (607) of the transducer (602).

A storage system (813) to collect the data that shall be sent to the remote central processing unit (818) for the interpretation of the data collected by each of the distributed sensors.

Wireless transmission means (819) for the bidirectional connection between each sensor equipment (600) and the remote central processing unit (818).

A backup power system (820) to prevent data loss in the event of failure of the electric power supply.

A synchronization system (821) to work with all the sensor equipment distributed with a common time base, and A microcontroller (822) for the integration, control and synchronization of all the necessary elements, as well as the sequencing of processes and communications.

The invention claimed is:

1. Method for locating faults in electric power distribution cables, the method applied to a medium voltage circuit that comprises at least one electric power distribution cable (205), a first transformation center (210) that comprises a first transformer and a first grounding conductor (603), a first grounding system comprising a first grounding resistor (RPAT1) connected to the first transformer through the first grounding conductor (603), the first transformation center (210) connected to a first end of the cable (205); and a second transformation center (220) comprising a second transformer and a second grounding conductor (603), a second grounding system comprising a second grounding resistor (RPAT2) connected to the second transformer through the second grounding conductor (603), the second transformation center (220) connected to a second end of the cable (205), the method characterized in that it comprises:

identifying a fault in the cable (205) by monitoring through current threshold in at least one of the grounding conductors (603), in case of fault identification:
measuring a first current value $I_{med1}$ through the first grounding conductor (603);
obtaining the value of the first resistor (RPAT1);
measuring a second current value $I_{med2}$ through the second grounding conductor (603);
obtaining the value of the second resistor (RPAT2);
calculating a relative distance d1 from a point on the cable (205) where the fault occurs to the first transformation center (210), such that:

$$d_1 = \frac{I_{med2} \cdot R_{PAT2} - I_{med1} \cdot R_{PAT1}}{(I_{med2} + I_{med1})}$$

calculating a distance d2 from the point on the cable (205) where the fault occurs to the second transformation center (210);

$$d_2 = \frac{I_{med2} \cdot (1 - R_{PAT2}) + I_{med1} \cdot (1 + R_{PAT1})}{(I_{med2} + I_{med1})}$$

identifying the fault location based on distances d1 and d2.

2. Method for the location of faults in electric power distribution cables according to claim 1, wherein obtaining the value of the first resistor (RPAT1) comprises identifying the resistive portion and the reactive portion of (RAPAT1) by means of a frequency sweep to obtain of a Bode magnitude and phase plot.

3. Method for the location of faults in electric power distribution cables according to claim 1, wherein obtaining the value of the second resistor (RPAT2) comprises identifying the resistive portion and the reactive portion of (RAPAT2) by means of a frequency sweep to obtain of a Bode magnitude and phase plot.

4. Method for the location of faults in electric power distribution cables according to claim 1, which further comprises informing a user of the fault condition and the location of the fault.

5. Fault detection system (800) for a medium voltage circuit comprising sets of an electric power distribution cable (205), a first transformation center (210) comprising a first transformer and a first grounding conductor (603), a first grounding system comprising a first grounding resistor (RPAT1) connected to the first transformer through the first grounding conductor (603), the first transformation center (210) connected to a first end of the cable (205); and a second transformation center (220) comprising a second transformer and a second grounding conductor (603), a second grounding system comprising a second grounding resistor (RPAT2) connected to the second transformer through the second grounding conductor (603), the second transformation center (220) connected to a second end of the cable (205), the fault detection system (800) comprises:
a set of sensors (600) comprising wireless communication means, and
a processing unit (818), wherein a first sensor (600) comprises means (602) for the connection to the first grounding conductor (603) and is configured to:
detect a cable fault (205) by detecting a threshold current value through the first grounding conductor (603), wherein in case of fault identification:
measuring a first current value $I_{med1}$ through the first grounding conductor (603);
obtaining the value of the first resistor (RPAT1); and
transmitting $I_{med1}$ and (RPAT1) to the processing unit (818),
wherein a second sensor (600) comprises means (602) for the connection to the second grounding conductor (603), and is configured to:
detect a cable fault (205) by detecting a threshold current value through the second grounding conductor (603), wherein in case of fault identification:
measuring a second current value $I_{med2}$ through the second grounding conductor (603);
obtaining the value of the second resistor (RPAT2); and
transmitting $I_{med2}$ and (RPAT2) to the processing unit (818);
wherein the processing unit (818) stores instructions for:
calculating a relative distance d1 from a point on the cable (205) where the fault occurs to the first transformation center (210), such that:

$$d_1 = \frac{I_{med2} \cdot R_{PAT2} - I_{med1} \cdot R_{PAT1}}{(I_{med2} + I_{med1})}$$

calculating a distance d2 from the point on the cable (205) where the fault occurs to the second transformation center (210);

$$d_2 = \frac{I_{med2} \cdot (1 - R_{PAT2}) + I_{med1} \cdot (1 + R_{PAT1})}{(I_{med2} + I_{med1})}$$

identifying the location of the cable fault (205) based on the distances d1 and d2.

6. Fault detection system (800) according to claim 5, wherein the means for connecting to the first and second grounding conductor (603) comprise a transducer (602).

7. Fault detection system (800) according to claim 5 comprising warning and display means configured to inform the user of the fault condition and the location of the fault.

8. Fault detection system (800) according to claim 5, wherein the sensors (600) comprise a current injection system (814) at multiple frequencies configured to be able to perform a frequency sweep to identify the resistive portion and the reactive portion of (RAPAT1, RPAT2).

9. Fault detection system (800) according to claim 5, wherein the sensors (600) comprise means for obtaining bode diagrams, in particular a magnitude measurement system comprising a programmable amplifier (817) and a phase shift measurement system (816) at multiple frequencies.

10. Fault detection system (800) according to claim 5, wherein the sensors (600) comprise a programmable gain amplifier (817) and a programmable threshold (811).

* * * * *